(12) United States Patent
Choy

(10) Patent No.: US 8,786,374 B2
(45) Date of Patent: Jul. 22, 2014

(54) ERROR DETECTION AT AN OSCILLATOR

(75) Inventor: Jon S. Choy, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 1 day.

(21) Appl. No.: 13/550,676

(22) Filed: Jul. 17, 2012

(65) Prior Publication Data

US 2014/0022022 A1 Jan. 23, 2014

(51) Int. Cl.
*H03K 3/03* (2006.01)

(52) U.S. Cl.
USPC ................................. 331/57; 331/44

(58) Field of Classification Search
USPC ................................. 331/44, 45, 57
See application file for complete search history.

(56) References Cited

U.S. PATENT DOCUMENTS

| | | | |
|---|---|---|---|
| 4,692,710 A | 9/1987 | Shvartsman | |
| 5,175,452 A * | 12/1992 | Lupi et al. | 327/262 |
| 5,337,022 A | 8/1994 | Pritchett | |
| 5,345,186 A * | 9/1994 | Lesmeister | 327/105 |
| 6,239,591 B1 * | 5/2001 | Bryant et al. | 324/762.05 |
| 6,657,504 B1 * | 12/2003 | Deal et al. | 331/57 |
| 7,113,606 B2 | 9/2006 | Botti et al. | |
| 7,302,026 B2 * | 11/2007 | Kaeriyama et al. | 375/355 |
| 7,463,096 B2 * | 12/2008 | Chi et al. | 331/2 |
| 7,504,896 B2 * | 3/2009 | Bhushan et al. | 331/57 |
| 7,733,189 B1 * | 6/2010 | Bennett | 331/64 |
| 7,786,763 B1 | 8/2010 | Bal et al. | |
| 7,855,607 B2 * | 12/2010 | Shimamoto | 331/57 |
| 2011/0128081 A1 * | 6/2011 | Hars | 331/57 |

OTHER PUBLICATIONS

Sasaki, Nobou, "Higher Harmonic Generation in CMOS/SOS Ring Oscillators," IEEE Transactions on Electron Devices, vol. Ed-29, No. 2; Feb. 1982; pp. 280-283.

* cited by examiner

*Primary Examiner* — Levi Gannon

(57) ABSTRACT

An error detection system employs a chain of delay elements connected in an open loop configuration. To determine whether the oscillator is operating within a specified set of parameters, the error detection system applies a start pulse to an input of the open-loop chain of delay elements. The error detection system compares the resulting output signal with the output of the oscillator. If the oscillator has locked onto a harmonic of the intended output frequency, the comparison of the output signals will indicate an error.

19 Claims, 4 Drawing Sheets

ERROR DETECTION AT AN OSCILLATOR

BACKGROUND

1. Field of the Disclosure

The present disclosure relates generally to electronic devices, and more particularly, to oscillators.

2. Description of the Related Art

Oscillators are used for a variety of applications in processors and other devices, such as generation of clock signals. An oscillator typically includes a set of internal nodes, where the generated periodic signal is based on the state of the internal nodes. During normal operation, each of the internal nodes alternates states at a particular frequency that determines the frequency of the periodic signal. Prior to starting of the oscillator, such as immediately following a reset of a processor, the internal nodes can be in unknown or indeterminate states. This can result in the generated output signal locking on to harmonic components of the desired output signal. The harmonic components result in an output signal that oscillates at a different frequency than intended.

BRIEF DESCRIPTION OF THE DRAWINGS

The present disclosure may be better understood, and its numerous features and advantages made apparent to those skilled in the art by referencing the accompanying drawings.

DETAILED DESCRIPTION

FIGS. 1-4 illustrate techniques for detecting an error at an oscillator. An error detection system employs a chain of delay elements connected in an open loop configuration. To determine whether the oscillator is operating within a specified set of parameters, the error detection system applies a start pulse to an input of the open-loop chain of delay elements (also referred to herein as an open-loop delay chain). The error detection system compares the resulting output signal with the output of the oscillator. If the oscillator has locked onto a harmonic of the desired output frequency, the comparison of the output signals will indicate an error. The use of an open-loop chain of delay elements allows the oscillator to be tested even when the absolute frequency of the oscillator is unknown. Further, the delay elements of the open-loop delay chain can be similar to the delay elements that are used in the oscillator under test, so that process and operational variations in the oscillator elements are matched by process and operational variations in the delay elements of the open-loop delay chain. The matching of the delay elements provides for a more robust testing system.

As used herein, an open-loop chain of delay elements (or an open-loop delay chain) refers to a set of delay elements connected in series in an open loop arrangement, where there is no feedback between an output of a particular delay element and an input of a previous delay element in the series. In one embodiment, the output of the open-loop delay chain is compared to the output of the oscillator using a counter. Assertion of the output signal of the open-loop delay chain enables adjustment of the counter value, and assertion of the output signal of the oscillator causes the counter value to be adjusted. The width of the start pulse applied to the open-loop delay chain during error detection is such that, if the oscillator is operating within the specified parameters, no adjustment of the counter will take place. However, if the oscillator has locked onto a harmonic frequency, the counter value will be adjusted. Thus, the value stored at the counter after conclusion of the start pulse will indicate whether the oscillator is operating properly or has locked onto a harmonic frequency. The counter value can therefore be used to determine whether to set an error flag, whether to reset the oscillator, or take other error-correcting measures.

Figure 1:
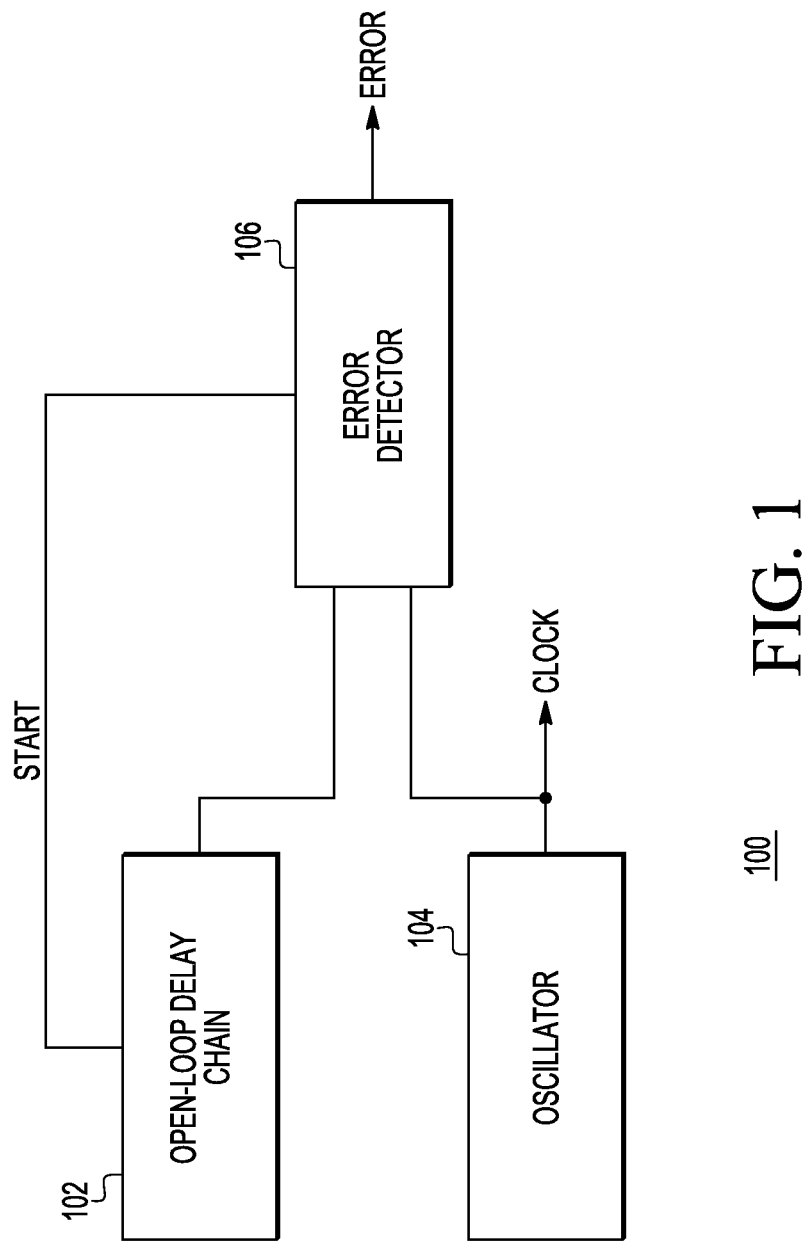
FIG. 1 illustrates a block diagram of an oscillator error detection system in accordance with a specific embodiment of the present disclosure.

FIG. 1 illustrates a block diagram of an oscillator testing system 100 in accordance with one embodiment of the present disclosure. The oscillator testing system 100 includes an open-loop delay chain 102, an oscillator 104, and an error detector 106. In an embodiment, the oscillator testing system 100 is incorporated as a portion of a processor, whereby the oscillator 104 is used to generate a clock signal for synchronization of one or more modules of the processor. As described further herein, the oscillator testing system 100 can be used during start-up or following a reset of the processor to ensure that the oscillator 104 is working properly prior to commencing normal operation of the processor.

The open-loop delay chain 102 is a chain of delay elements connected in series in an open loop configuration. The chain of delay elements includes a sufficient number of delay elements to provide a delayed representation of a signal applied at the chain input. In the illustrated embodiment the open-loop delay chain 102 includes an input to receive a signal labeled "Start" and an output. Accordingly, the open-loop delay chain 102 provides a delayed and inverted representation of the Start signal at its output. The delay elements of the open-loop delay chain 102 can each have a single ended output or a fully differential output. Thus, each delay element can be, for example an inverter having a single ended output or a set of transistors that provides a differential output that is 180 degrees out of phase with a differential input signal. In addition, each delay element can include one bias or more biases in addition to a supply reference and ground reference. The biases can be either voltage or current biases.

The oscillator 104 can be a ring oscillator, a current controlled oscillator, or other oscillator type. After start-up, the oscillator 104 provides an output signal that periodically oscillates at a frequency. Under normal operation, with all internal nodes of the oscillator 104 operating within specified parameters, the frequency will be set at a nominal rate, referred to herein as the nominal frequency. However, process variations, environmental conditions, and other parameters can cause one or more of the internal nodes of the oscillator 104 to enter an unusual or undesired state during start-up, which can cause the oscillator output signal to lock to one or more harmonics of the nominal frequency. The resulting output signal will therefore have a higher frequency than the nominal frequency. Use of the output signal when it is locked to the harmonics of the nominal frequency can cause undesirable operation of a device. For example, a processor using the oscillator output signal at the incorrect frequency can experience timing errors, consume an excessive of power, and the like.

In an embodiment, the oscillator 104 includes a chain of delay elements connected such that the final delay element in the chain is connected to the input of the first element in the chain. The delay elements of the oscillator 104 can share a common design with the delay elements of the open-loop delay chain 102, so that variations in the behavior of one chain due to process variations, operational conditions, and the like, are likely to be matched by variations in the behavior of the other chain. Accordingly, in one embodiment, the delay elements of the oscillator 104 and the delay elements of the open-loop delay chain 102 are each connected to receive one or more bias signals, in addition to being connected to common supply and ground references. That is, each of the delay elements of the open-loop delay chain receives the same bias signals as delay elements of the oscillator 104. The bias signals can be voltage biases or current biases.

The error detector 106 is configured to apply, via the Start signal, a pulse to the input of the open-loop delay chain 102 and to compare the resulting output signal with the output signal of the oscillator 104. The length of the pulse is set such that, if the oscillator output signal is at the nominal frequency, the oscillator output signal will not undergo a transition during assertion of the output signal of the open-loop delay chain 102. If the oscillator output signal has locked onto one or more harmonics, the output signal will undergo one or more transitions during assertion of the output signal of the open-loop delay chain 102. Accordingly, if the error detector 106 determines that the output signal of the oscillator 104 has undergone a transition while the output of the open-loop delay chain 102 is asserted, the error detector 106 asserts a signal labeled "Error." In response to assertion of the Error signal, a processor or other module (not shown) can take remedial action, such as setting an error flag, resetting the oscillator 104, switching a clock signal source from the oscillator 104 to another oscillator, and the like.

Figure 2:
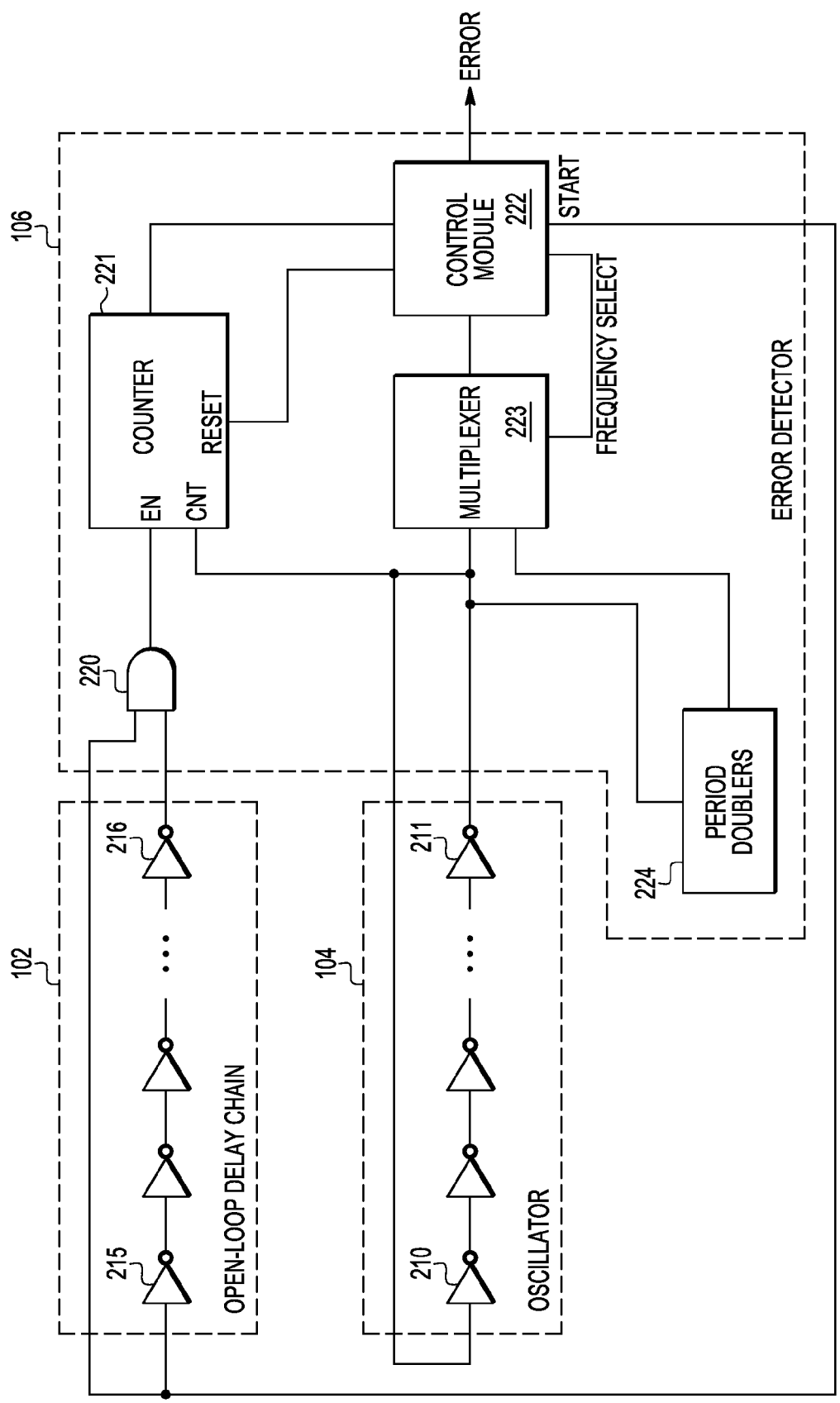
FIG. 2 is a block diagram of the oscillator error detection system of FIG. 1 in accordance with a specific embodiment of the present disclosure.
Figure 3:
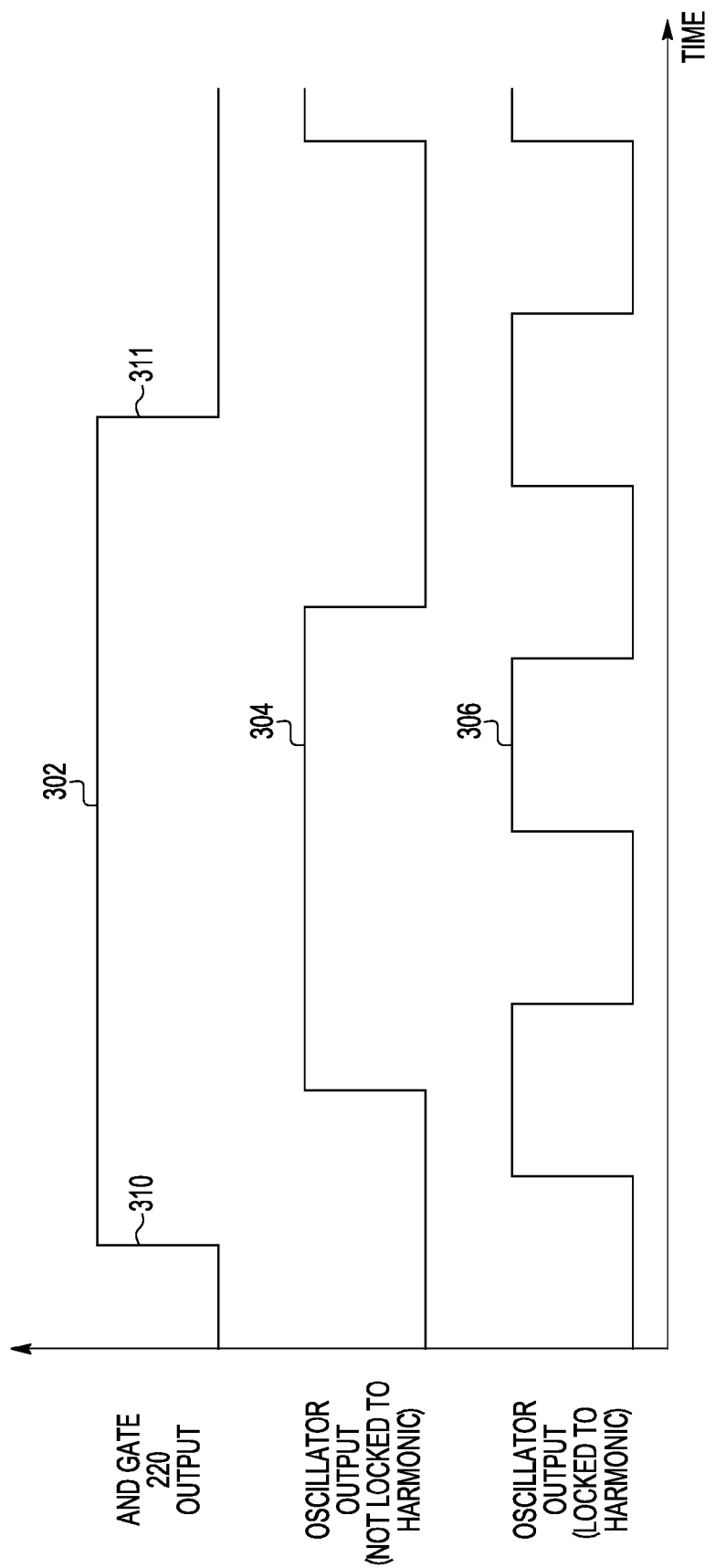
FIG. 3 is a timing diagram illustrating operation of the oscillator error detection system of FIG. 2 in accordance with a specific embodiment of the present disclosure.

FIG. 2 illustrates additional details of the oscillator testing system 100 in accordance with one embodiment of the present disclosure. In the illustrated embodiment, the oscillator 104 includes a set of delay elements, including delay elements 210 through Nth delay element 211. In one embodiment, the delay elements 210 through 211 are single-ended delay elements and N is an odd-numbered integer so that the last delay element in the chain (delay element 211) provides an inverted representation of the previous input at the initial delay element in the chain (delay element 210), thereby causing the output signal to oscillate.

In another embodiment, the delay elements 210 through 211 are differential delay elements. In the case of differential delay elements, N can be an even or odd numbered integer. If N is an even numbered integer, the last delay element 211 can have its inputs reversed relative to the other delay elements to achieve an inversion. The output of the last delay element 211 is fed back to the input of the initial delay element 210. The effect of the delay elements 210 through 211 is to provide an output signal that is 180 degrees out of phase with the input signal to the delay elements. Accordingly, the feedback arrangement of the set of delay elements results in an oscillating signal at the output of the oscillator 104.

The open-loop delay chain 102 includes a chain of delay elements, including delay element 215 through Mth delay element 216, where M is an integer. The delay elements 215 through 216 are connected in series, but there is no feedback between an output of one of the delay elements and an input of a previous delay element in the series. The open-loop delay chain 102 is an inverting delay chain. Accordingly, in the illustrated embodiment, the delay element 216 provides an inverted and delayed representation of the Start signal applied at the input of delay element 215. In an embodiment, the delay elements 215 through 216 are configured similarly to the delay elements 210 through 211 of the oscillator 104, and include the same number of delay elements (that is, M=N). Accordingly, each of the delay elements includes the same number of transistors and other components arranged in the same fashion and connected to the same voltage references and receiving the same bias signals. This ensures that, during operation, any variation in the behavior of the delay elements of the oscillator 104 will be matched by a similar variation in the behavior of the delay elements of the open-loop delay chain 216. This provides for a more robust testing system.

The error detector 106 includes an AND gate 220, a counter 221, a control module 222, a multiplexer 223, and period doublers 224. The AND gate 220 includes an input to receive the Start signal, an input connected to the output of the open-loop delay chain 102, and an output. The counter 221 includes an enable input, labeled "EN", connected to the output of the OR gate 220, a count input, labeled "CNT", connected to the output of the oscillator 104, a reset input, labeled "Reset", and an output. The period doublers 224 include an input connected to the output of the oscillator 104 and an output. The multiplexer 223 includes an input connected to the output of the period doublers 224, an input connected to the output of the oscillator 104, a control input, and an output. The control module 222 includes an input connected to the output of the multiplexer 223, an output to provide a signal labeled "Frequency Select" to the control input of the multiplexer 223, an input connected to the output of the counter 221, an output connected to the reset input of the counter 221, and an output to provide the Error signal.

When it is enabled by a signal at the EN input being in the asserted state, the counter 221 is configured to adjust its stored value in response to assertions of the signal at its CNT input. Accordingly, in operation the control module 222 commences a test of the oscillator 104 by asserting a pulse via the Start signal. This causes a delayed representation of the pulse being provided at the output of the open-loop delay chain 216, which in turn causes assertion of the signal at the EN input of the counter 221. The counter 221 is therefore enabled for adjustment, so that any assertions of the output signal of the oscillator 104 will cause the counter value to be adjusted. The counter 221 is configured to be reset to a default or initial state in response to assertion of a signal at the reset input.

The length of the pulse provided via the Start signal is such that the counter value will be adjusted if the oscillator output signal has locked onto harmonics. This can be better understood with reference to FIG. 3, which illustrates a timing diagram showing the operation of the testing system 100 both when the oscillator 104 has locked to harmonics and when it is providing an output signal at the nominal frequency. In particular, waveform 302 illustrates the output of the AND gate 220, waveform 304 illustrates the output signal of the oscillator 304 when it is not locked to harmonics of the nominal frequency, and waveform 306 illustrates the output signal of the oscillator 304 when it is locked to harmonics of the nominal frequency.

Prior to time 310, the Start signal is in a negated state and the output of the open-loop delay chain 216 provides an asserted signal at its output, so that the output of the AND gate 220 is a negated signal. In addition, prior to time 310 the control module 222 resets the counter 221 by asserting the signal at the reset input. At time 310, the Start signal is asserted by control module 222. Accordingly, at time 310 both of the inputs to the AND gate 220 are asserted. In response the output signal of the AND gate 220 is asserted, thereby enabling the counter 221. At time 311, the assertion of the Start signal has propagated through to the output of the open-loop delay chain 102, resulting in negation of the chain's output signal. Accordingly, at time 311 the output of the AND gate 220 transitions to a negated state, disabling the counter 221. Accordingly, between time 310 and time 311, the counter 221 is enabled. The counter 221 will therefore adjust (e.g. increment in the case of an incrementing counter or decrement in the case of a decrementing counter) its stored value in response to assertion of the output signal of the oscillator 104. As illustrated by waveform 304, when the oscillator output is not locked to a harmonic, there is a single assertion of the output signal, such that the value of the counter 221 is adjusted only once. In contrast, as illustrated by waveform 306, when the oscillator output is locked to a harmonic, there are several assertions of the output signal, so the value of the counter 221 will be adjusted multiple times. Thus, the value stored at the counter 221 will depend on whether the output signal of the oscillator 104 is locked to one or more harmonics.

Returning to FIG. 2, a designated period of time after it asserts the pulse via the Start signal, the control module 222 reads the value stored at the counter 221. If the value indicates that the output signal of the oscillator 104 is locked onto one or more harmonics, the control module 222 provides an indication of an error via the Error signal. In response, a processor or other module can take remedial action, such as resetting the oscillator 104, setting an error flag, and the like.

In the illustrated embodiment, the operations of the control module 222 are synchronized by the output signal of the multiplexer 223. The period doublers 224 are configured to divide the frequency of the output signal of the oscillator 104 by a defined multiple of 2, such as 4 or 6. In an embodiment, the period doublers 224 are a set of flip-flops connected in series, with the first flip-flop clocked by the output signal of the oscillator 104 and each subsequent flip-flop in the series clocked by the non-inverting output of the flip-flop. Each inverting output of the flip-flop is fed back to the input of the respective flip-flop. The non-inverting output of the final flip-flop in the series provides the output of the period doublers 224. Under this configuration, each flip-flop in the series doubles the period (and halves the frequency) of its clock input signal.

The operations of the control module 222 are synchronized to the signal provided by the multiplexer 222. Upon start up, the control module 222 selects the output of the oscillator 104 to be provided. However, if the output signal of the oscillator 104 is locked onto harmonics, the signal may cause improper operation of the control module 222. Accordingly, in response to determining an error in its own operation, the control module 222 can alter the Frequency Select signal so that the output of the period doublers 224 is provided as the output of the multiplexer 223. In another embodiment, the control module 222 can be synchronized by a clock signal generated independently of the oscillator 104.

Figure 4:
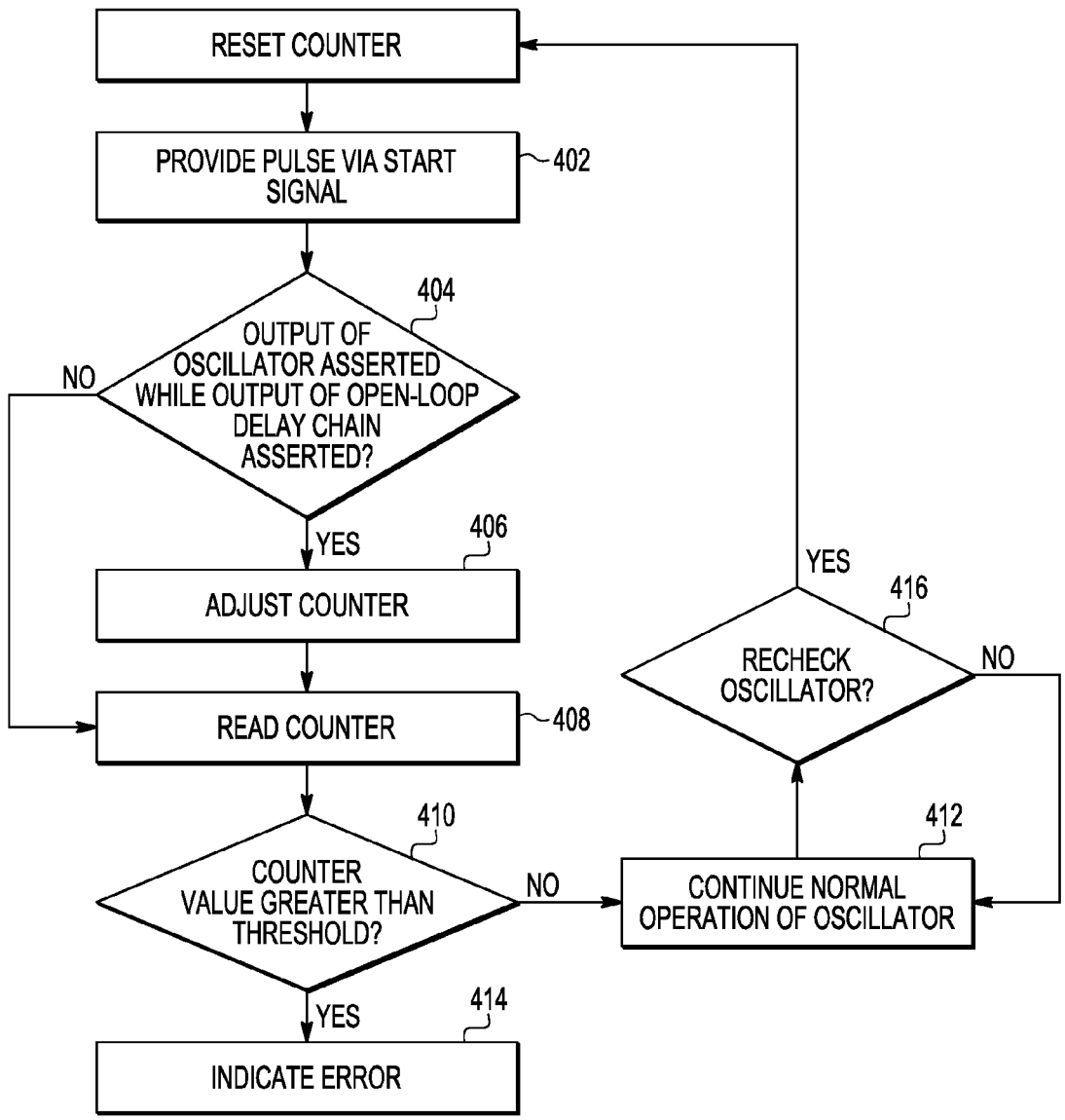
FIG. 4 is a flow diagram illustrating a method of detecting errors at an oscillator in accordance with a specific embodiment of the present disclosure.

FIG. 4 illustrates a flow diagram of a method of detecting an error at an oscillator in accordance with one embodiment of the present disclosure. For ease of description, the method is described in the context of the system of FIG. 2. At block 401, the control module 222 resets the counter by asserting a signal at the reset input. At block 402, the control module 222 provides a pulse via the Start signal. At block 404, the counter 221 determines whether the output signal of the oscillator 104 is asserted while the output of the AND gate 220. If not, the method flow moves to block 408 and the counter value is not adjusted. If the output signal of the oscillator 104 is asserted while the output of the open-loop delay chain 102 is asserted, the method flow moves to block 406 and the counter 221 adjusts its stored value.

At block 408, the control module 222 reads the value of the counter 221. At block 410, the control module 222 determines whether the counter value is greater than a threshold value. If not, this indicates that the output signal of the oscillator 104 is at the nominal frequency. Accordingly, the method flow moves to block 412 and the oscillator 104 continues its normal operation. The method flow proceeds to block 416 and the control module 222 determines whether operation of the oscillator 104 is to be rechecked. The control module 222 can make this determination based on one or more of a variety of factors, including expiration of a timer, detection of one or more system conditions, and the like. If the control module 222 determines that the operation of the oscillator 104 is not to be rechecked, the method flow returns to block 412 and the oscillator 104 continues its normal operation. If the control module 222 determines that the operation of the oscillator 104 is not to be rechecked, the method flow returns to block 401 and the control module 222 resets the counter prior to sending another start pulse.

Returning to block 410, if it is determined that the counter value is greater than the threshold value, the method flow moves to block 414 and the control module 222 indicates an error via the Error signal.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A method, comprising:
    generating an output signal at an open-loop chain of delay elements;
    determining an oscillator is locked to a harmonic of a desired frequency based on the output signal; and
    resetting the oscillator in response to determining the oscillator is locked to the harmonic.

2. The method of claim 1, further comprising determining the oscillator is locked to the harmonic based on a comparison between the output signal of the open-loop chain of delay elements and an output signal of the oscillator.

3. The method of claim 1, wherein determining the oscillator is locked to the harmonic comprises:
    enabling a counter based on the output signal of the open-loop chain of delay elements;
    asserting a signal to change a value stored at the counter based on an output signal of the oscillator; and
    determining the oscillator is locked to the harmonic based on the value stored at the counter.

4. The method of claim 3, wherein enabling the counter comprises enabling the counter based on a logical AND function of the output signal of the open-loop chain of delay elements and a start pulse.

5. The method of claim 4, wherein generating the output signal of the open-loop chain of delay elements comprises applying the start pulse to an input of the open-loop chain of delay elements to generate the output signal.

6. The method of claim 4, further comprising generating the start pulse at a control module synchronized with the output signal of the oscillator.

7. The method of claim 1, further comprising setting an indicator at a processor in response to determining the oscillator is locked to the harmonic.

8. The method of claim 1, wherein the oscillator comprises a plurality of delay elements, the delay elements of the oscillator having a same circuit configuration as the delay elements of the open loop chain of delay elements.

9. A method, comprising:
enabling a counter based on an output signal of an open-loop chain of delay elements;
adjusting the counter based on an output of an oscillator;
detecting the oscillator is locked to a harmonic of a desired frequency based on a value of the counter; and
resetting the oscillator in response to determining the oscillator is locked to the harmonic.

10. The method of claim 9, further comprising:
enabling the counter based on a logical AND function of the output signal and a start pulse generated at a control module.

11. The method of claim 10, wherein synchronizing the control module comprises generating a signal based on the output of the oscillator, the signal having a lower frequency than the output of the oscillator, and synchronizing the control module using the first signal.

12. The method of claim 11, wherein synchronizing the control module using the signal comprises synchronizing the control module using the first signal in response to determining an error in operation of the control module.

13. A device, comprising:
an oscillator;
an open-loop chain of delay elements; and
an error detection module to:
determine the oscillator is locked to a harmonic of a desired frequency based on the output signal of the oscillator and an output signal of the open-loop chain of delay elements; and
reset the oscillator in response to determining the oscillator is locked to the harmonic.

14. The device of claim 13, wherein the error detection module determines the oscillator is locked to the harmonic based on a comparison between the output signal of the open-loop chain of delay elements and an output signal of the oscillator.

15. The device of claim 13, wherein the error detection module comprises a counter, the counter comprising:
an enable input coupled to an output of the open-loop chain of delay elements;
an adjustment input coupled to an output of the oscillator, the counter to adjust a stored value in response to assertion of a signal at the adjustment input when a signal at the enable input is asserted; and
wherein the error detection module is to determine the oscillator is locked to the harmonic based on the stored value.

16. The device of claim 13, wherein the error detection module further comprises a counter and a logic circuit, the logic circuit to perform an AND function comprising an input to receive a start pulse, an input coupled to the output of the open-loop delay chain, and an output coupled to the enable input of the counter.

17. The device of claim 16, wherein the open-loop chain of delay elements comprises an input to receive the start pulse.

18. The device of claim 16, wherein the error detection module comprises a control module to generate the start pulse, the control module synchronized based on the output signal of the oscillator.

19. The device of claim 13, wherein the oscillator comprises a plurality of delay elements, the delay elements of the oscillator having a same circuit configuration as the delay elements of the open loop chain of delay elements.

* * * * *